(12) United States Patent
Choi et al.

(10) Patent No.: US 6,194,124 B1
(45) Date of Patent: Feb. 27, 2001

(54) PHOTOSENSITIVE CERAMIC COMPOSITIONS CONTAINING POLYCARBONATE POLYMERS

(75) Inventors: John Haetak Choi, Wilmington; Neville Everton Drysdale, Newark, both of DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/373,494

(22) Filed: Aug. 12, 1999

(51) Int. Cl.$^7$ ..................................................... G03C 1/73
(52) U.S. Cl. ................................. 430/287.1; 430/281.1; 430/286.1; 430/905; 430/913; 549/228
(58) Field of Search ............................. 430/270.1, 281.1, 430/286.1, 287.1, 905, 913; 549/228

(56) References Cited

U.S. PATENT DOCUMENTS

| | | | |
|---|---|---|---|
| 4,440,937 | 4/1984 | Krimm et al. | 549/228 |
| 4,551,415 | * 11/1985 | Cohen et al. | 430/281.1 |
| 4,598,037 | * 7/1986 | Felten | 430/281.1 |
| 4,613,560 | * 9/1986 | Duebar et al. | 430/286.1 |
| 4,654,095 | 3/1987 | Steinberg | 156/89 |
| 4,752,531 | 6/1988 | Steinberg | 428/426 |
| 4,908,296 | * 3/1990 | Nebe et al. | 430/281.1 |
| 5,032,478 | 7/1991 | Nebe et al. | 430/281 |
| 5,035,980 | 7/1991 | Nebe et al. | 430/281 |
| 5,049,480 | 9/1991 | Nebe et al. | 430/281 |
| 5,089,070 | 2/1992 | McAndrew | 156/89 |
| 5,874,197 | * 2/1999 | Felten | 430/281.1 |
| 6,093,792 | * 7/2000 | Gross et al. | 528/354 |

FOREIGN PATENT DOCUMENTS

| | | |
|---|---|---|
| 62-292815 | * 12/1987 | (JP) . |
| 62-292816 | * 12/1987 | (JP) . |
| 10048825 | * 2/1998 | (JP) . |
| 11143061 | * 5/1999 | (JP) . |

OTHER PUBLICATIONS

Karl D. Weilandt, et al., Synthesis and Ring–Opening Polymerization of 2–Acetoxymethyl–2–Alkyltrimethylene Carbonates and of 2–Methoxycarbonyl–2–Methyltrimethylene Carbonate; A Comparison with the Polymeriation of 2,2–Dimethyltrimethylene Carbonate, *Macromol. Chem. Phys.*, 197, 3851–3868, 1996.

* cited by examiner

*Primary Examiner*—Janet Baxter
*Assistant Examiner*—Yvette M Clarke

(57) ABSTRACT

The invention is directed to polymer comprising the repeat unit

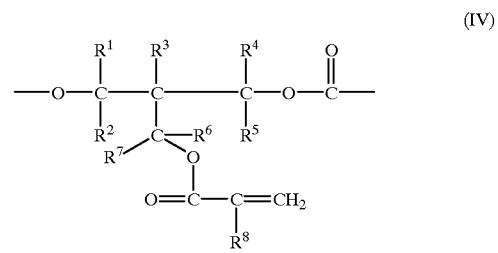

(IV)

wherein each of $R^1$ through $R^7$ are independently hydrogen or alkyl, and $R^8$ is hydrogen or methyl. The invention is further directed to a photosensitive composition comprising an admixture of: (a) finely divided particles if inorganic solids selected from the group consisting of ceramic, metal, metal oxide or metal alloy; (b) finely divided particles of an inorganic binder having a glass transition temperature in the range of form 550 to 825° C. a surface area to weight ratio of no greater than 10 m$^2$/g and at least 95 wt. % of the particles having a size of 1–10 μm, dispersed in an organic vehicle comprising; (c) polymer as recited herein above; (d) photoinitiation system; (e) organic medium. With removal of the organic medium the above composition can be utilized for a tape. Also, in the given composition the polymer as recited above may be replaced by the polycarbonate resulting from the polymerization of 5-carbomethoxy-5-methyl-1,3-dioxin-2-one.

11 Claims, No Drawings

PHOTOSENSITIVE CERAMIC COMPOSITIONS CONTAINING POLYCARBONATE POLYMERS

FIELD OF THE INVENTION

The invention is directed to a new polycarbonate polymer and its use in a photosensitive composition and tape.

BACKGROUND OF THE INVENTION

Photosensitive pastes are widely used in electronic circuit fabrications to build conductors, resistors, dielectrics, or substrates. There is a need in the industry to replace the use of pastes with ceramic green tapes. Ceramic tapes are used primarily as a dielectric or insulating material for building multilayer ceramic substrates and other current tape products.

Both pastes and tapes contain components such as polymers, surfactants, plasticizers, photoreactive components, etc., which give certain pastes and tapes green properties that are necessary in their use. The organics are removed completely from the system during the process to achieve end use properties. Such organic removal is normally done by a thermal heating of the system above the highest decomposition temperature of the organic components ("burn-out" process).

As the application of the ceramic tape/paste products gets increasingly sophisticated and expands into new technology areas, there is a growing need to lower the ceiling temperature for the organic burn-out. One such need, for example, exists in the product development for the plasma display panel, one of emerging flat panel display technologies, where the window glass is used for the panel substrate and therefore the firing temperature has to be kept below the low softening temperature of the substrate glass (~600C).

The decomposition temperature of organics currently used in the industry for ceramic products (cellulose or acrylate polymers and monomers after polymerization) is close to the high end limit allowed for the burn-out step in a number of applications. Therefore, the polycarbonates and use of such polycarbonates, as disclosed herein, meet the need of a lower decomposition temperature which may be used in pastes and tapes.

SUMMARY OF THE INVENTION

The invention is directed to polymer comprising the repeat unit

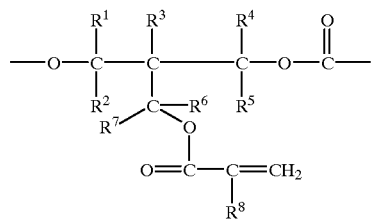

(IV)

wherein each of $R^1$ through $R^7$ are independently hydrogen or alkyl, and $R^8$ is hydrogen or methyl.

The invention is further directed to a photosensitive composition comprising an admixture of: (a) finely divided particles if inorganic solids selected from the group consisting of ceramic, metal, metal oxide or metal alloy; (b) finely divided particles of an inorganic binder having a glass transition temperature in the range of form 550 to 825° C. a surface area to weight ratio of no greater than 10 m²/g and at least 95 wt. % of the particles having a size of 1–10 μm, dispersed in an organic vehicle comprising; (c) polymer as recited herein above; (d) photoinitiation system; (e) organic medium. With removal of the organic medium the above composition can be utilized for a tape. Also, in the given composition the polymer as recited above may be replaced by the polycarbonate resulting from the polymerization of 5-carbomethoxy-5-methyl-1,3-dioxin-2-one.

DETAILED DESCRIPTION

The invention includes the use of polymers carbonated in the back bone with acrylate pendant groups known as polycarbonates which are used in photosensitive thick film compositions for pastes and tapes. Polycarbonate polymers can replace the standard acrylic monomers and/or polymers in conventional photosensitive compositions. The tapes or pastes that include the use of polycarbonates are intended for applications where the firing temperature for organic burn-out is limited by the substrate material. The invention utilizes the low thermal decomposition temperature of the carbonate group in the backbone of the polymer. The invention is also directed to a new polycarbonate polymer and its use in compositions for pastes and tapes. In order to produce pastes and tapes with lower decomposition temperatures a class of polycarbonate polymer binders are admixed with inorganic solids and inorganic binders accompanied by a photoinitiation system to form photosensitive pastes and tapes. Components of the invention are discussed hereinbelow along with a new polycarbonate polymer.

A. Ceramic Solids and Metal Powders

The invention is applicable to virtually any high melting inorganic solid material which include ceramic, metal, metal alloy, metal oxide or mixtures thereof. However, it is particularly suitable for making dispersions of dielectric pastes or tapes using solids such as alumina, titanates, zirconates and stannates. It is also applicable to precursors of such materials, i.e., solid materials which upon firing are converted to dielectric solids, and to mixtures of any of these. Among the many dielectric solids which are likely to be used in the invention are $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$. As will be apparent to those skilled in the ceramic arts, the exact chemical composition of the ceramic solids to be used in the composition of the invention is not ordinarily critical in the rheological sense. It is also preferred that the ceramic solids not have swelling characteristics in the organic dispersion since the rheological properties of the dispersion may be substantially changed thereby. Examples of suitable conductive inorganic solids may include for example silver, gold, copper, platinum and alloys, oxides and mixtures thereof and lead ruthenate pyrochlore.

It has been found that the dispersion of the invention must contain no significant amount of solids having a particle size of less than 0.3 μm in order to obtain adequately complete burnout of the organic medium when the films or layers thereof are fired to remove the organic medium and to effect sintering of the inorganic binder and the ceramic solids. However, it is preferred that none of the ceramic solids exceed 20 μm and, furthermore, at least 75 wt. % of the inorganic solids should have a size of 1–10 μm. In other words, when the dispersions are used to make thick film pastes, which are usually applied by screen printing, the maximum particle size must not exceed the thickness of the screen, and when the dispersion is used to make dry photosensitive film, the maximum particle size must not exceed the thickness of the film. It is preferred that at least 90 wt. % of the inorganic solids fall within the 1–10 μm range.

In addition, it is preferred that surface area/weight ratio of the ceramic particles not exceed 10 m²/g for the reason that such particles tend to affect adversely the sintering characteristics of the accompanying inorganic binder. It is still further preferred that the surface area/weight ratio not exceed 5 m²/g. Ceramic particles having a surface area/weight ratio of 1–5 have been found to be quite satisfactory.

B. Inorganic Binder

The glass frit used in the present invention aids in sintering the inorganic crystalline particulates and may be of any well known composition which has a melting temperature below that of the inorganic solids. Nevertheless, in order to get adequate hermeticity of the devices, it is preferred that the glass transition temperature (Tg) of the inorganic binder be 550–825° C. and still more preferably 575–750° C. If melting takes place below 550° C., organic material will likely be encapsulated and blisters will tend to form in the dielectric layer as the organics decompose. On the other hand, a glass transition temperature above 825° C. will tend to produce a porous dielectric when sintering temperatures compatible with copper metallizations, e.g., 900° C., are used.

The glass frits most preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compound that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form melt. As is well known in the art, heating is conducted to a peak temperature and for a time such that the melt becomes entirely liquid and homogeneous. In the present work, the components are premixed by shaking in a polyethylene jar with plastic balls and then melted in a platinum crucible at the desired temperature. The melt is heated at the peak temperature for a period of 1 to 1½ hours. The melt is then poured into cold water. The maximum temperature of the water during quenching is kept as low as possibly by increasing the water-to-melt ratio. The crude frit after separation from water is freed of residual water by drying in air or displacing the water by rinsing with methanol. The crude frit is then ball milled for 3–5 hours in alumina containers using alumina balls. Alumina contamination of the frit is not within the observable limit of x-ray diffraction analysis.

After discharging the milled-frit slurry from the mill, excess solvent is removed by decantation and the frit powder is air dried at room temperature. The dried powder is then screened through a 325-mesh screen to remove any large particles. The inorganic binder, like the ceramic solids, should have a surface-to-weight ratio of no more than 10 m²/g and at least 95 wt. % of the particles should have a particle size of 1–10 μm.

It is preferred that the 50% point of the inorganic binder, which is defined as equal parts by weight of both larger and smaller particles, be equal to or less than that of the ceramic solids. For given particle size ceramic solids, the inorganic binder/ceramic solids ratio required to achieve hermeticity will decrease as the inorganic binder size decreases. With a given inorganic solids-inorganic binder system, if the ratio of inorganic binder to inorganic solids is significantly higher than that required to achieve hermeticity, the dielectric layer tends to form blisters on firing. If the ratio is significantly lower, the fired dielectric will be porous and therefore nonhermetic.

Within the above-described particle size and surface area limits, it is nevertheless preferred that the inorganic binder particles be 1–6 μm. The reason for this is that smaller particles having a high surface area tend to adsorb the organic materials and thus impede clean decomposition. On the other hand, larger size particles tend to have poorer sintering characteristics. It is preferred that the ratio of inorganic binder to ceramic solids be 0.6–2.

C. Photocrosslinkable Organic Polymer/Monomer

As set out hereinabove, the binder component of the dispersion of the invention is an organic polycarbonate polymer. The resulting polymer of the polymerization of 5-carbomethoxy-5-methyl-1,3-dioxan-2-one may be used as a component of the polymer binder. The polycarbonate polymer of 5-carbomethoxy-5-methyl-1,3-dioxan-2-one may be prepared as disclosed in Weilandt, K. D., Keul, H. and Hocker, H., Macromol. Chem. Phys. 197, 3851–3868 (1996). 5-Carbomethoxy-5-methyl-1,3-dioxan-2-one may be prepared via the reaction of 2,2-bis(hydroxymethyl) propionic acid with methanol to give methyl 2,2-bis (hydroxymethyl)propionate, which was then reacted with triphosgene in the presence of triethylamine to afford the desired product, 5-carbomethoxy-5-methyl-1,3-dioxan-2-one, as a white solid.

Another option for the selection of a polycarbonate polymer is that resulting from the polymerization of the meth (acrylate) ester of 5-ethyl-5-hydroxymethyl-1,3 dioxan-2-one. The meth(acrylate) ester of 5-ethyl-5-hydroxymethyl-1,3 dioxan-2-one may be prepared from meth(acryloyl) chloride and 5-ethyl-5-hydroxymethyl-1,3 dioxan-2-one in the presence of triethylamine as the acid scavenger. The preparation of 5-ethyl-5-hydroxymethyl-1,3 dioxan-2-one is disclosed in U.S. Pat. No. 4,440,937 to Krimm et al.

Polymerization of the (meth)acrylate esters of cyclic carbonates such as 5-ethyl-5-hydroxymethyl-1,3 dioxan-2-one results in polymers having repeat unit (IV).

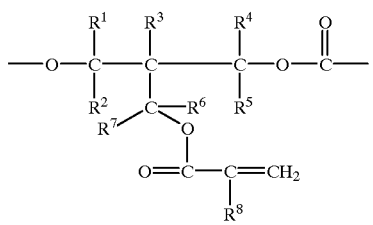

(IV)

This polymer may be a homopolymer or a copolymer, for example by copolymerizing with other cyclic carbonates. The polymer may be a polycarbonate or a poly(carbonate-ester), or other copolymer. It is preferred that $R^1$, $R^2$ and $R^4$ through $R^7$ are hydrogen, and $R^3$ is alkyl, more preferably ethyl. For $R^1$ through $R^7$ it is also preferred that alkyl contain 1 to 20 carbon atoms.

The polymerization of the meth(acrylate) ester of 5-ethyl-5-hydroxy-methyl-1,3 dioxan-2-one (1) occurs readily in both solution and in bulk with catalysts such as yttrium triisopropoxide or stannous octanoate to give the polycarbonate. Often other transesterification catalysts may also be used to catalyze this polymerization. The polymerization with stannous octanoate was performed in bulk at 120° C. The resulting polycarbonate (2) often has a broad polydispersity. As the concentration of catalyst decreases, the molecular weight of the polycarbonates usually increases as expected, but this increase is often not linear.

Polymerizations initiated with yttrium triisopropoxide usually produced polycarbonate with polydispersities of ~2. As was the case with stannous octanoate, as the catalyst concentration decreases, the molecular weight of the polymer increases. Thermogravimetric analysis (TGA) shows that the polymer decomposes totally above 200° C. in a non-oxidizing environment, i.e., nitrogen.

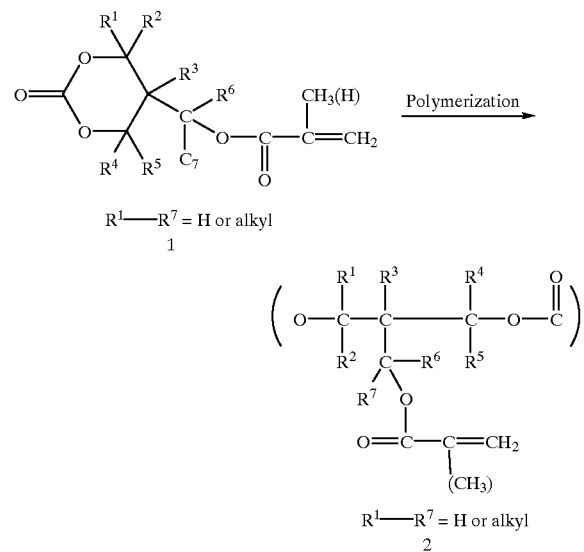

As a manifestation of the potential of this polymer to undergo crosslinking reaction upon removal of the polymerization solvent such as methylene chloride or ethyl acetate, and in the absence of added stabilizer such as phenothiazine, a crosslinked, insoluble material results after drying under vacuum overnight. If a stabilizer is present or unneeded, crosslinking may be effected by photopolymerization or radical polymerization, in the presence or absence of other polymerizable (meth)acrylates (see below). Therefore, the polycarbonate resulting from polymerization of 5-carbomethoxy-5-methyl-1,3-dioxan-2-one may be used as a binder in a paste or tape photoresist formulation with the use of a conventional photoformable monomer. The molecular weight of the polycarbonate will depend on the application wherein molecular weights less than 10,000 Mn are useful in paste compositions and above 10,000 are useful in tapes or sheets.

The polycarbonate resulting from the polymerization of (meth)acrylate ester of 5-ethyl-5-hydroxymethyl-1,3 dioxan-2-one may be used as a crosslinkable binder in a paste or tape photoresist formulation with or without the use of a conventional photoformable monomer. The molecular weight of the polycarbonate will depend on the application wherein molecular weights less than 10,000 are useful in paste compositions and above 10,000 are useful in tapes or sheets.

A polycarbonate with low weight average molecular weight (Mw<10,000) has a low melting point and may require mixing with other compatible high molecular weight polymers to make the coated film sufficiently dry to form a tape although the low molecular weight polycarbonate is a good choice for paste manufacture. Polyalkylcarbonate polymers are preferred compatible polymers. The polycarbonate polymer may also be used with an auxiliary thermally degradable polymeric binders of which the preferred are: (1) homopolymer and copolymers of $C_{1-10}$ alkyl acrylates, $C_{1-10}$ alkyl methacrylates, alpha-methyl-styrene and 0–2 wt. % ethylenically unsaturated carboxylic acid, amine or silane-containing compounds, (2) homopolymers and copolymers of $C_{1-10}$ mono-olefins, (3) homopolymers and copolymers of $C_{1-4}$ alkylene oxide and mixtures thereof.

A polycarbonate with low molecular weight (Mn<10,000) may be used in conjunction with other conventional (meth) acrylate monomers. Such preferred monomers include t-butyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethyacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di-(p-hydroxyphenyl)propane dimethacrylate, di-(3-methacryloxy-2-hydroxypropyl)ether of bisphenol-A, di-(2-methacryloxyethyl) ether of bisphenol-A, di-(3-acryloxy-2-hydroxypropyl)ether of bisphenol-A, di-(2-acryloxyethyl) ether of bisphenol-A, di-(3-methacrloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are polyoxyethylated trimethylolpropane triacrylate, ethylated pentaerythritol triacrylate, dipentaerythritol monohydroxypentaacrylate and 1,10-decanediol dimethlacrylate. Some of photohardenable monomers which may be used in this invention in conjuction with the above mentioned carbonate polymers are certain mono-, di- and tri-functional methacrylates corresponding to the following chemical structures:

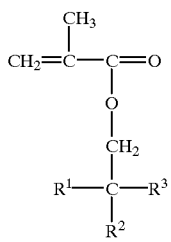

Monofunctional monomer (I)

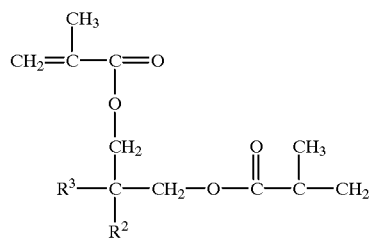

Difunctional monomer (II)

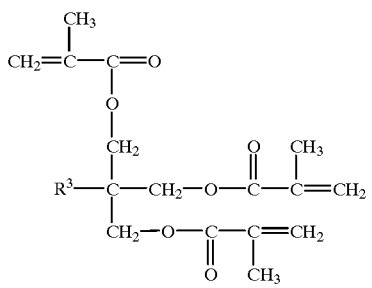

Trifunctional monomer (III)

wherein $R^1$, $R^2$ and $R^3$ are independently selected from alkyl, aryl or aralkyl groups or if one of the three R groups is H, then the other two R groups are preferred to be selected from alkyl, aryl or aralkyl groups. Examples of the former are 2,2-dimethylpropane dimethacrylate (DMPDMA) and trimethylolpropane trimethacrylate (TMPTMA).

D. Photoinitiation System

Suitable photoinitiation systems are those which are thermally inactive but which generate free radicals upon exposure to actinic light at ambient temperature. These include the substituted or unsubstituted polynuclear quinones which are compounds having two intracyclic carbon atoms in a conjugated carbocyclic ring system, e.g., 9,10-anthraquinone, 2-methylanthraquinone, 2-ethylanthraquinone, 2-tert-butylanthraquinone, octamethylanthraquinone, 1,4-naphthoquinone, 9,10-phenanthrenequinone, benz(a)anthracene-7,12-dione, 2,3-naphthacene-5,12-dione, 2-methyl-1,4-naphthoquinone, 1,4-dimethyl-anthraquinone, 2,3-dimethyl-anthraquinone, 2-phenylanthraquinone, 2,3-diphenylanthraquinone, retenequinone, 7,8,9,10-tetrahydronaphthracene-5,12-dione, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445, 2,875,047, 3,097,096, 3,074,974, 3,097,097, and 3,145,104, as well as dyes of the phenazine, oxazine, and quinone classes, Michler's ketone, benzophenone, 2,4,5-triphenylimidazolyl dimers with hydrogen donors including leuco dyes and mixtures thereof as described in U.S. Pat. Nos. 3,427,161, 3,479,185, and 3,549,367 can be used as initiators. Also useful with photoinitiators and photoinhibitors are sensitizers disclosed in U.S. Pat. No. 4,162,162. The photoinitiator or photoinitiator system is present in 0.05 to 10% by weight based on the total weight of the dry photopolymerizable layer.

E. Organic Medium

The main purpose of the organic medium is to serve as a vehicle for dispersion of the finely divided solids of the composition in such form that it can readily be applied to a ceramic or other substrate. Thus, the organic medium must first be one in which the solids are dispersible with an adequate degree of stability. Secondly, the rheological properties of the organic medium must be such that they lend good application properties to the dispersion.

When the dispersion is to be made into a film, the organic medium in which the ceramic solids and inorganic binder are dispersed consists of the above-described polymeric binder, monomer and initiator which are dissolved in a volatile organic solvent and, optionally, other dissolved materials such as plasticizers, release agents, dispersing agents, stripping agents, antifouling agents and wetting agents.

The solvent component of the organic medium, which may be a mixture of solvents, is chosen so as to obtain complete solution therein of the polymer and to be of sufficiently high volatility to enable the solvent to be evaporated from the dispersion in an ambient atmosphere or by the application of relatively low levels of heat at atmospheric pressure. In addition, the solvent must boil well below the boiling point and decomposition temperature of any other additives contained in the organic medium. Thus, solvents having atmospheric boiling points below 150° C. are used most frequently. Such solvents include ethylacetate, methanol, isoproanol, acetone, xylene, ethanol, methylethyl ketone, 2,2,4-triethyl pentanediol-1,3-monoisobutyrate, toluene, and ethylene glycol monoalkyl and dialkyl ethers such as ethylene glycol mono-n-propyl ether.

Frequently the organic medium will also contain one or more plasticizers, if additional film softness is needed. Such plasticizers help to assure good lamination to ceramic substrates and enhance the developability of unexposed areas of the composition. However, the use of such materials should be minimized in order to reduce the amount of organic materials which must be removed when the films cast therefrom are fired. The choice of plasticizers is, of course, determined primarily by the polymer which must be modified. Among the plasticizers which have been used in various binder systems are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate triethyleneglycol diacetate and polyester plasticizers.

F. Slip Preparation

Slip is a properly dispersed mixture of inorganic powders dispersed in an organic medium. Common way of achieving good dispersion of inorganic powders in the organic medium is by using a conventional ball-milling method. A ball milling consists of ceramic milling jar and milling medium (spherical or cylindrical shaped alumina or zirconia pellets). The total mixture is put into the milling jar and the milling media are added. After closing the jar with a leak-tight lid, it is rolled on a roller to create tumbling action of the milling media inside the jar at a rolling speed at which the mixing efficiency is optimum. The length of the rolling is the time required to attain well dispersed inorganic particles to meet the performance specifications. A poor dispersion leads to unacceptable edge bump in the final fired part.

The slip may be applied to a substrate by a blade or bar coating method, followed by ambient or heat drying. The slip is then casted into a tape form on a substrate base by a conventional coating method. The casted tape is simply applied to a substrate by a simple hot-roll lamination such as the one used in dry film photoresist industries. The coating thickness after drying, may range from a few micron to several tens of microns depending on the application.

The tape coating operation is similar to the one used in conventional photoresist coating. The slip is extruded out through a slot die on a moving web of polyethylene terephthalate(PET) film substrate, passed through drying zones to thermally-evaporate the coating solvent into a dry tape form, and then laminated onto a coversheet before it is wound as a widestock roll. The coversheet is used to protect the tape from sticking the other side of the base film in a wound roll. Silicone coated PET film, polypropylene, or polyethylene may be used as a coversheet. The coversheet is removed before the lamination to the substrate. Therefore, the coversheet must have weaker adhesion to the tape than that of the base film so that the separation can occur between the coversheet and the tape at the time of its removal.

It is preferred that the weight ratio of the inorganic solids to organics be within the range of 2.0 to 6.0 and, more preferably, from 2.6 to 4.5. A ratio of no more than 6.0 is necessary to obtain adequate dispersion, photosensitive, and rheological properties. However, below 2.5, the amount of organics, which must be burned off, is excessive and the quality of the final layers suffers. The ratio of inorganic solids to organics is dependent on the particle size of the inorganic solids, the organic components and on surface pretreatment of the inorganic solids. When the particles are treated with organosilane coupling agents, the ratio of inorganic solids to organics can be increased. It is preferred to use a lower level of organics to minimize firing defects. It is especially important that the ratio of inorganics to organics be as high as possible. Organosilanes suitable for use in the invention are those corresponding to the general formula $Rsi(OR')_3$ in which R' is methyl or ethyl and R is selected from alkyl, methacryloxypropyl, polyalkylene oxide or other organic functional groups which interact with the organic matrix of the film.

G. Paste Preparation

When the dispersion is to be applied as a thick film paste, conventional thick film organic media can be used with appropriate rheological adjustments and the use of lower volatility solvents.

When the compositions of the invention are formulated as thick film compositions, they will usually be applied to a substrate by means of screen printing. Therefore, they must have appropriate viscosity so that they can be passed through the screen readily. In addition, they should be thixotropic in order that they set up rapidly after being screened, thereby giving good resolution. While the rheological properties are of primary importance, the organic medium is preferably formulated also to give appropriate wettability of the solids and the substrate, good drying rate, dried film strength sufficient to withstand rough handling and good firing properties. Satisfactory appearance of the fired composition is also important.

In view of all these criteria, a wide variety of inert liquids can be used as organic media. The organic medium for most thick film compositions is typically a solution of resin in a solvent and, frequently, a solvent solution containing both resin and thixotropic agent. The solvent usually boils within the range of 130–350° C.

Especially suitable resins for this purpose are polymethacrylates of lower alcohols and monobutyl ether of ethylene glycol monoacetate.

The most widely used solvents for thick film applications are terpenes such as alpha- or beta-terpineol or mixtures thereof with other solvents such as kerosene, dibutylphthalate, butyl carbitol, butyl carbitol acetate, hexamethylene glycol and high boiling alcohols and alcohol esters. Various combinations of these and other solvents are formulated to obtain the desired viscosity and volatility requirements for each application.

Among the thixotropic agents which are commonly used are hydrogenated castor oil and derivatives thereof. It is, of course, not always necessary to incorporate a thixotropic agent since the solvent/resin properties coupled with the shear thinning inherent in any suspension may alone be suitable in this regard.

The ratio of organic medium to inorganic solids in the dispersions can vary considerably and depends upon the manner in which the dispersion is to be applied and the kind of organic medium used. Normally, to achieve good coverage, the dispersions will contain complementary by weight 60–90% solids and 40–10% organic medium. Such dispersions are usually of semifluid consistency and are referred to commonly as "pastes".

The pastes are conveniently prepared on a three-roll mill. The viscosity of the pastes is typically within the following ranges when measured at room temperature on Brookfield viscometers at low, moderate and high shear rates:

| Shear Rate (Sec$^{-1}$) | Viscosity (Pa * S) | |
|---|---|---|
| 0.2 | 100–5000 | — |
|  | 300–2000 | Preferred |
|  | 600–1500 | Most preferred |
| 4 | 40–400 | — |
|  | 100–250 | Preferred |
|  | 140–200 | Most preferred |
| 384 | 7–40 | — |
|  | 10–25 | Preferred |
|  | 12–18 | Most preferred |

The amount and type of organic medium (vehicle) utilized is determined mainly by the final desired formulation viscosity and print thickness.

Various dyes and pigments may also be added to increase visibility of the photo image. Any colorant used, however, should preferably be transparent to the actinic radiation used, although it may be opaque or strongly absorb other radiation in the visible or UV spectral region.

In addition to the many parameters of properties and composition described above, it is also essential that all of the components-both inorganic and organic-be substantially free of halogens. The reason for this is that under normal firing conditions, halogenated compounds cause corrosion of adjoining conductive layers as well as the surfaces of the furnace in which they are fired.

The present invention will be described in further detail by giving practical examples. The scope of the present invention, however, is not limited in any way by these practical examples.

EXAMPLES

All values given in the tables are in weight % based on total composition.

POLYCARBONATE PREPARATION

Example 1

Preparation of the monomer methacrylate ester of 5-ethyl-5-hydroxymethyl-1,3-dioxan-2-one In a dry box, in a two liter flask equipped with a mechanical stirrer and a pressure equalizing addition funnel were added THF (600 mL), 5-ethyl-5-hydromethyl-1,3-dixan-2-one (160 g) and freshly distilled triethylamine (152 g). Methacryloyl chloride was placed in the addition funnel. Under nitrogen the apparatus was removed from the dry box and the solution cooled to −87° C. Methacryloyl chloride was slowly added to the cooled solution with stirring. After the completion of the amine addition the mixture was allowed to warm to room temperature, then stirred overnight at room temperature. The triethylamine/HCl salt was removed via filtration and the filtrate concentrated at reduced pressure. The resulting material was dissolved in methylene chloride and then washed with water (3×200 mL) and dried over anhydrous sodium sulfate. After removal of the sodium sulfate, via filtration, the filtrate was concentrated at reduced pressure. The thick viscous material was precipitated by the addition of hexane (300 mL), the white solid was filtered and dried under vacuum giving ~140 g of product.

Typical solution polymerization of methacrylate ester of 5-ethyl-5-hydroxymethyl-1,3-dioxan-2-one In a dry box, in a vial equipped with a stirrer methacrylate ester of 5-ethyl-5-hydroxymethyl-1,3-dioxan-2-one (2.00 g) and methylene chloride (2.0 mL) were added. After the formation of a homogenous solution yttrium triisopropoxide (0.5 mL, 0.1M solution in toluene) was added. After three hours, the polymerization was terminated by the addition of methylene chloride and water. The organic phase was separated and again washed with water, dried over anhydrous sodium sulfate and then concentrated at reduced pressure and then dried under vacuum for 1 hour. An equal amount of ethyl acetate was then added to make up a 50% solid solution. If drying is allowed to continue overnight an intractable mass will be obtained the next day. Gel Permeation chromatography (PS STD): 11,660, PD=3.99.

Component Materials

In the examples which are set out below, the following component materials were used having the indicated properties:

Example 2 a. Formulation for dielectric slip

| Chemicals | Wt % |
| --- | --- |
| Polymer A | 13.90 |
| IRGACURE ® 1850 | 1.39 |
| Pigment | 0.69 |
| BENZOFLEX ® | 2.50 |
| Frit | 46.41 |
| Alumina | 35.11 |
| Total | 100.00 | b. Process

Prepared coating slip by (1) dissolving all organics in solvent (Ethylacetate and methanol 10:1 mixture) to give total solvent content of 28 wt %, (2) adding inorganics and milling media in a milling jar, and (3) milling for about 24 hours;

Using draw-down coating process, coated the slip directly on a slide glass substrate to give about 2 mil thickness when dried ambiently;

Exposed through a silver halide target with the silver emulsion in contact with the coating surface under vacuum at 1000 mj/cm$^2$;

Developed with tripropylene glycol monoethylether (TPM);

Fire using standard green tape firing profile to burn off organics.

Example 3 a. Formulation for dielectric tape

| Chemicals | Wt % |
| --- | --- |
| Polymer B as a sole photohardener | |
| Polymer B | 15.06 |
| IRGACURE ® 1850 | 1.50 |
| BENZOFLEX ® | 2.71 |
| Frit | 36.30 |
| Alumina | 44.43 |
| Total | 100.00 |
| Polymer B used in conjunction with monomer | |
| Polymer B | 9.31 |
| TMPEOTA | 5.32 |
| IRGACURE ® 1850 | 1.33 |
| Itaconic acid | 0.66 |
| BENZOFLEX ® | 3.32 |
| Frit | 36.04 |
| Alumina | 44.02 |
| Total | 100.00 | b. Process: Same as above-except that ethylacetate was used as the developer chemical instead of TPM.

Glossary

Polymer A—polycarbonate resulting from the polymerization of methacrylate ester of 5-hydroxymethyl-5-ethyl-1,3 dioxan-2-one (Mw~9300).

Polymer B—polycarbonate resulting from the polymerization of methacrylate ester of 5-hydroxymethyl-5-ethyl-1,3 dioxan-2-one (Mw~20300).

IRGACURE®—50/50 blend of bis(2,6-dibenzoyl)(2,4,4-trimethylpentyl)phosphine oxide and 1-hydroxycyclohexyl phenyl ketone; Organic photointiator blend; Ciba-Geigy Specialty Chemicals, Oak Brook, Ill. 60521

Pigment—Cobalt chromite Blue-Green Spinel; The Shepherd Color Company, 4539 Dues Drive, Cincinnati, Ohio 45246

BENZOFLEX®—BENZOFLEX 400 Plasticizer; Polypropylene glycol dibenzoate, $(C_3H_6)_nCl_4H_{10}O_3$; Velsicol Chemical Corporation, 5600 N. River Road, Rosemont, Ill. 60018

Frit—Alkaline earth aluminum lead borosilicate glass frit; Ferro frit; Manufacturer-DuPont; Alumina $Al_2O_3$ powder; Manufacturer-DuPont TMPEOTA—trimethylolpropane-triethoxy-triacylate; oligomeric monomer; Sartomer SR 545; Sartomer Company, Oaklands Corporate Center, 468 Thomas Jones Way, Exton, Pa. 19341 STRUCTURE: $CH_3—CH_2—C—(—CH_2—(O—CH_2—CH_2—)_3—O(CO—CH=CH_2)_3CH_2=C(COOH)(CH_2—COOH)$ Itaconic Acid -Stabilizer, Aldrich Company

We claim:

1. A polymer comprising the repeat unit

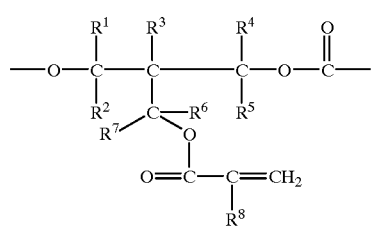

(IV)

wherein each of $R^1$ through $R^7$ are independently hydrogen or alkyl, and $R^8$ is hydrogen or methyl.

2. The polymer as recited in claim 1 wherein all of $R^1$, $R^2$ and $R^4$ through $R^7$ are hydrogen, and $R^3$ is ethyl.

3. The polymer as recited in claim 1 which is a homopolymer.

4. The polymer as recited in claim 1 which is a copolymer.

5. The polymer as recited in claim 1 which has been crosslinked.

6. A photosensitive composition comprising an admixture of:
   (a) finely divided particles of inorganic solids selected from the group consisting of ceramic, metal, metal oxide or metal alloy;
   (b) finely divided particles of an inorganic binder having a glass transition temperature in the range of form 550 to 825° C. a surface area to weight ratio of no greater than 10 m²/g and at least 95 wt. % of the particles having a size of 1–10 μm, dispersed in an organic vehicle comprising;
   (c) polymer as recited in claim 1;
   (d) photoinitiation system;
   (e) organic medium.

7. The composition of claim 6 further comprising photohardenable monomer.

8. A photosensitive green tape comprising:
   (a) finely divided particles of inorganic solids selected from the group consisting of ceramic, metal, metal oxide or metal alloy;
   (b) finely divided particles of an inorganic binder having a glass transition temperature in the range of form 550 to 825° C. a surface area to weight ratio of no greater than 10 m²/g and at least 95 wt. % of the particles having a size of 1–10 μm, dispersed in an organic vehicle comprising;
   (c) polymer as recited in claim 1;
   (d) photoinitiation system.

9. The composition of claim 8 further comprising photohardenable monomer.

10. A photosensitive composition comprising an admixture of:
    (a) finely divided particles of inorganic solids selected from the group consisting of ceramic, metal, metal oxide or metal alloy;
    (b) finely divided particles of an inorganic binder having a glass transition temperature in the range of form 550 to 825° C. a surface area to weight ratio of no greater than 10 m²/g and at least 95 wt. % of the particles having a size of 1–10 μm, dispersed in an organic vehicle comprising;
    (c) polycarbonate resulting from the polymerization of 5-carbomethoxy-5-methyl-1,3-dioxin-2-one;
    (d) photoinitiation system;
    (e) photohardenable monomer; and
    (f) organic medium.

11. A photosensitive green tape comprising:
    (a) finely divided particles of inorganic solids selected from the group consisting of ceramic, metal, metal oxide or metal alloy;
    (b) finely divided particles of an inorganic binder having a glass transition temperature in the range of form 550 to 825° C. a surface area to weight ratio of no greater than 10 m²/g and at least 95 wt. % of the particles having a size of 1–10 μm, dispersed in an organic vehicle comprising;
    (c) polycarbonate resulting from the polymerization of 5-carbomethoxy-5-methyl-1,3-dioxin-2-one;
    (d) photoinitiation system, and
    (e) photohardenable monomer.

* * * * *

UNITED STATES PATENT AND TRADEMARK OFFICE
CERTIFICATE OF CORRECTION

PATENT NO. : 6,194,124 B1  
DATED : February 27, 2001  
INVENTOR(S) : John Haetak Choi et al.

Page 1 of 1

It is certified that error appears in the above-identified patent and that said Letters Patent is hereby corrected as shown below:

Title page,  
Abstract,  
Line 8, from the Equation, delete "form" and substitute -- from -- therefor.

Column 2,  
Line 1, delete "form" and substitute -- from -- therefor.

Claims,  
Claim 6,  
Line 7, delete "form" and substitute -- from -- therefor.

Claim 8,  
Line 6, delete "form" and substitute -- from -- therefor.

Claim 10,  
Line 7, delete "form" and substitute -- from -- therefor.

Claim 11,  
Line 6, delete "form" and substitute -- from -- therefor.

Signed and Sealed this

Sixteenth Day of October, 2001

Attest:

*Nicholas P. Godici*

NICHOLAS P. GODICI  
*Attesting Officer*     *Acting Director of the United States Patent and Trademark Office*